(12) United States Patent
Chung et al.

(10) Patent No.: US 7,064,427 B2
(45) Date of Patent: Jun. 20, 2006

(54) BURIED ARRAY CAPACITOR AND MICROELECTRONIC STRUCTURE INCORPORATING THE SAME

(75) Inventors: Stephen Chung, Kaohsiung (TW);
Jungle Lee, Hsinchu (TW); Shinn-Juh Lay, Hsinchu (TW); Randy Wu, Taoyuan (TW); Huey-Ru Chang, Hsinchu (TW); Yu-Mei Cheng, Taoyuan (TW)

(73) Assignee: Industrial Technology Research Institute, Hsinchu (TW)

( * ) Notice: Subject to any disclaimer, the term of this patent is extended or adjusted under 35 U.S.C. 154(b) by 80 days.

(21) Appl. No.: 10/863,700

(22) Filed: Jun. 7, 2004

(65) Prior Publication Data

US 2005/0269685 A1    Dec. 8, 2005

(51) Int. Cl.
*H01L 23/04* (2006.01)
(52) U.S. Cl. ....................... 257/698; 361/302

(58) Field of Classification Search ................ 257/664, 257/691, 692, 698; 361/301.2, 302, 328
See application file for complete search history.

(56) References Cited

U.S. PATENT DOCUMENTS 6,847,527 B1 * 1/2005 Sylvester et al. ........... 361/763

* cited by examiner

*Primary Examiner*—David Vu
(74) *Attorney, Agent, or Firm*—Akin Gump Strauss Hauer & Feld, LLP

(57) ABSTRACT

A unitary buried array capacitor and microelectronic structures incorporating such capacitors are disclosed. A unitary buried array capacitor can be formed by a top layer of electrode, a middle layer of dielectric, and a bottom layer of electrode. A first electrode lead, a second electrode lead and at least one interconnect line pass through the three layers while only the first electrode lead making electrical contact with the top layer of electrode and only the second electrode lead making electrical contact with the bottom electrode.

23 Claims, 4 Drawing Sheets

BURIED ARRAY CAPACITOR AND MICROELECTRONIC STRUCTURE INCORPORATING THE SAME

FIELD OF THE INVENTION

The present invention generally relates to a microelectronic capacitor and more particularly, relates to a buried array capacitor (BAC) and a microelectronic structure incorporating the capacitor.

BACKGROUND OF THE INVENTION

In modern microelectronic devices that require high operating frequency and high operating speed, the rise time for the signals that are transmitted in the microelectronic circuit necessarily becomes shorter and shorter. The demand for an acceptable timing budget and noise margin also becomes more stringent. The stability of a microelectronic circuit is not only an important criterion for its application, but also directly determined by the noise immunity of the circuit. The noise immunity must cover all major sources of noises such as reflection noise, coupling noise and switching noise.

The reflection noise of a microelectronic circuit can be controlled by suitably matching the electrical resistance of the circuit, while the coupling noise can be suitably controlled by the distance between and the length of parallel lines. However, the switching noise, or sometimes known as simultaneous switching noise, which is produced by high speed turn-on/turn-off, must be filtered by utilizing high capacity decoupling capacitor or bypass capacitors. High capacity or large number of decoupling capacitors render the miniaturization of microelectronic devices impossible, i.e., it is impossible to produce thin and small devices when a large number of capacitors are required. Moreover, noise signals are proportional to the length of the current passage. The distance between the wiring that connects the capacitors to the circuit must be maintained as short as possible in order to achieve a noise filtering effect. The necessity of increasing the substrate area for positioning more capacitors and thus not achieving the desirable short distance has become a major difficulty for circuit designers.

Surface mountable devices (SMD) have been widely used in modern microelectronic circuits for their ease in fabrication. However, as surface mountable devices are miniaturized to reduce their footprints, the capacitance of the device also becomes smaller with the decreasing footprint. It is difficult to reduce the size of capacitors of high capacitance for packaging into a surface mountable device. If a large number of capacitors are used, the layout of the circuit on a substrate becomes more complicated while the packaging of the device becomes more difficult and costly.

In packaging a high pin-count (larger than 2000 pins) chip, since the capacitors for a surface mountable device is positioned at a distance from the chip, the noise signals are necessarily increased. Moreover, the longer distance between the capacitors and the chip further limits the execution speed of the device.

In order to reduce the area occupied by passive components and the fabrication cost, the current trend in microelectronic processing is to embed the passive components into the substrate. While technologies utilizing high dielectric constant materials on an organic substrate to form embedded capacitors in order to achieve high density existed, the substrate structure is complicated that it requires special fabrication steps at high cost. It also increases the difficulty in circuit layout. Moreover, the area occupied by the embedded capacitor is determined by the dielectric constant of the capacitor material, for instance, a large capacitor area is required when the dielectric constant of the capacitor material is not sufficiently high, i.e., in the case of an organic substrate such as FR-4.

It is therefore an object of the present invention to provide a buried array capacitor in microelectronic applications that does not have the drawbacks or shortcomings of the conventional imbedded capacitors.

It is another object of the present invention to provide a buried array capacitor for use in microelectronic structures that is space efficient.

It is a further object of the present invention to provide a unitary buried array capacitor formed by two layers of electrode sandwiching a middle layer of dielectric that has a dielectric constant larger than 40.

It is another further object of the present invention to provide a microelectronic structure that incorporates the present invention buried array capacitor.

It is still another object of the present invention to provide a buried array capacitor formed by unitary buried array capacitors stacked together in an up-and-down manner.

It is yet another object of the present invention to provide a buried array capacitor formed by unitary buried array capacitors positioned in a side-by-side relationship.

SUMMARY OF THE INVENTION

In accordance with the present invention, a buried array capacitor and a microelectronic structure incorporating the capacitor are disclosed.

In a preferred embodiment, a unitary buried array capacitor is provided which includes a top layer of electrodes having a first electrode lead, a second electrode lead and at least one interconnect line therethrough wherein only the first electrode lead making electrical connection with the top layer of electrode; a middle layer of dielectric sandwiched between the top layer of electrode and the bottom layer of electrode, and a bottom layer of electrode having the first electrode lead, the second electrode lead and the at least one interconnect line therethrough; the bottom layer of electrode having the first electrode lead, the second electrode lead and the at least one interconnect line therethrough wherein only the second electrode lead making electrical connection with the bottom layer of electrode; and the at least one interconnect line passing through the top, middle and bottom layers without making electrical contact with the top layer or bottom layer.

In the unitary buried array capacitor, the top layer and the bottom layer of electrode are spaced apart by a distance between about 1 μm and about 50 μm, or preferably spaced apart by a distance between about 5 μm and about 15 μm. The middle layer dielectric may be formed of a material that has a dielectric constant of at least 40, or formed of a material that has a dielectric constant between about 40 and about 300. The middle layer of dielectric may be formed of a material that includes Ta and O. The top layer of electrode and the bottom layer of electrode may be formed of a material selected from the group consisting of Cu, Au, Ag, Pd, Pt and Al. The at least one interconnect line may be formed of Cu or Al.

The present invention is further directed to a buried array capacitor that includes m unitary buried array capacitors, each arranged stacked together in an up-and-down relationship with the others wherein m being equal or greater than 2 and the unitary buried array capacitor includes a top layer of electrode that has a first electrode lead, a second electrode lead and at least one interconnect line therethrough wherein only the first electrode lead making electrical connection with the top layer of electrode; a middle layer of dielectric sandwiched between the top layer of electrode and a bottom layer of electrode having the first electrode lead, the second electrode lead and the at least one interconnect line therethrough; the bottom layer of electrode having the first electrode lead, the second electrode lead and the at least one interconnect line therethrough wherein only the second electrode lead making electrical connection with the bottom layer of electrode; and the at least one interconnect line passing through the top, middle and bottom layers without making electrical contact with the top layer or bottom layer.

The present invention is still further directed to a buried array capacitor that includes n unitary buried array capacitors, each arranged in a side-by-side relationship with the others wherein n is equal or greater than 2 and the unitary buried array capacitor includes a top layer of electrode that has a first electrode lead, a second electrode lead and at least one interconnect line therethrough wherein only the first electrode lead making electrical connection with the top layer of electrode; a middle layer of dielectric sandwiched between the top layer of electrode and a bottom layer of electrode having the first electrode lead, the second electrode lead and the at least one interconnect line therethrough; the bottom layer of electrode having the first electrode lead, the second electrode lead and the at least one interconnect line therethrough wherein only the second electrode lead making electrical connection with the bottom layer of electrode; and the at least one interconnect line passing through the top, middle and bottom layers without making electrical contact with the top layer or bottom layer.

The present invention is still further directed to a buried array capacitor that includes m unitary buried array capacitors, each arranged stacked together in an up-and-down relationship with the others; and n unitary buried array capacitors each arranged in a side-by-side relationship with the others, wherein m and n are equal or greater than 2 and wherein the unitary buried array capacitor includes a top layer of electrodes that has a first electrode lead, a second electrode lead and at least one interconnect line therethrough wherein only the first electrode lead making electrical connection with the top layer of electrode; a middle layer of dielectric sandwiched between the top layer of electrode and a bottom layer of electrode having the first electrode lead, the second electrode lead and the at least one interconnect line therethrough; the bottom layer of electrode having the first electrode lead, the second electrode lead and the at least one interconnect line therethrough wherein only the second electrode lead making electrical connection with the bottom layer of electrode; and the at least one interconnect line passing through the top, middle and bottom layers without making electrical contact with the top layer or bottom layer.

The present invention is still further directed to a microelectronic structure that incorporates a buried array capacitor which includes m unitary buried array capacitors, each arranged stacked together in an up-and-down relationship with others; and n unitary buried array capacitors, each arranged in a side-by-side relationship with the others, wherein m and n are equal or greater than 2 and wherein the unitary buried array capacitor includes a top layer of electrode that has a first electrode lead, a second electrode lead and at least one interconnect line therethrough wherein only the first electrode lead making electrical connection with the top layer of electrode; a middle layer of dielectric sandwiched between the top layer of electrode and a bottom layer of electrode having the first electrode lead, the second electrode lead and the at least one interconnect line therethrough; the bottom layer of electrode having the first electrode lead, the second electrode lead and the at least one interconnect line therethrough wherein only the second electrode lead making electrical connection with the bottom layer of electrode; and the at least one interconnect line passing through the top, middle and bottom layers without making electrical contact with the top layer or bottom layer; a first wiring layer on the top layer of electrode; a second wiring layer on the bottom layer of electrode; and at least one integrated circuit device mounted on at least one of the first and the second wiring layers in electrical communication with the buried array capacitor.

In the microelectronic structure incorporating a buried array capacitor, the top layer of electrode and the bottom layer electrode are spaced apart by a distance between about 1 µm and about 50 µm, or preferably are spaced apart by a distance between about 5 µm and about 15 µm. The middle layer of dielectric may be formed of a material that has a dielectric constant of at least 40, or having a dielectric constant between about 40 and about 300. The top layer of electrode and the bottom layer of electrode are formed of a material selected from the group consisting of Cu, Au, Ag, Pd, Pt and Al. The at least one interconnect line may be formed of Cu or Al.

BRIEF DESCRIPTION OF THE DRAWINGS

These and other objects, features and advantages of the present invention will become apparent from the following detailed description and the appended drawings in which:

FIG. 6B is an enlarged, cross-sectional view of another embodiment of a microelectronic structure formed with the present invention buried array capacitor with a wiring layer in-between.

DETAILED DESCRIPTION OF THE PREFERRED AND ALTERNATE EMBODIMENTS

The present invention discloses a buried array capacitor structure that has low switching noise, wide frequency band and low resistance. It is formed by a planar capacitor substrate for electrical communication with a semiconductor wafer through an interface. The planar capacitor substrate is formed by a high dielectric constant material for an array of capacitors such that any member of capacitors in the array can be connected together to form a desirable capacitance desired for a microelectronic circuit. The present invention buried array capacitor provides the benefits of wide frequency band, low resistance and efficient noise filtering such that switching noise can be effectively reduced to maintain a stable operation of an IC chip.

The present invention buried array capacitor substrate can be connected directly to a semiconductor wafer such that subsequent fabrication processes for passive components of capacitors and for surface mountable devices can be reduced.

Figure 1A:
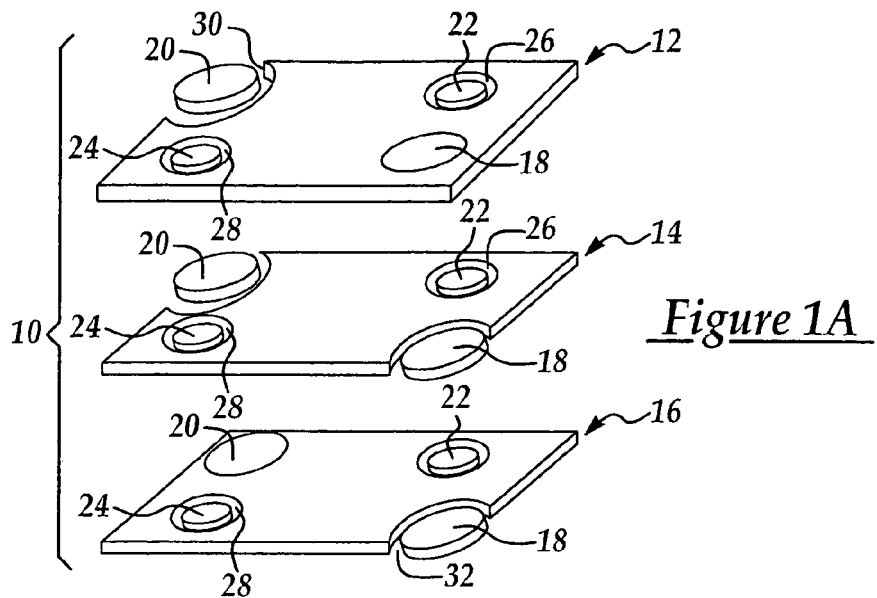
FIG. 1A is a perspective view of the present invention unitary buried array capacitor.

Referring initially to FIG. 1A, wherein an enlarged, perspective view of a present invention unitary buried array capacitor 10 is shown. The unitary buried array capacitor 10 is constructed by a top layer of electrode 12, a middle layer of dielectric 14 and a bottom layer of electrode 16. The top layer of electrode 12 has a first electrode lead 18, a second electrode lead 20 and two interconnect lines 22, 24 passing through via holes 26, 28, respectively, without making electrical contact with the top layer of electrode 12. The second electrode lead 20 further passes through via hole 30 without making electrical contact with the top layer of electrode 12. The middle layer of dielectric 14 is sandwiched between the top layer of electrode 12 and the bottom layer of electrode 16 with the first electrode lead 18, the second electrode lead 20 and the 12 interconnect lines 22, 24 going through the middle layer of dielectric 14. The bottom layer of electrode 16 has the same first electrode lead 18, the second electrode lead 20 and the two interconnect lines 22, 24 passing therethrough while only the second electrode lead 20 making electrical contact with the bottom layer of electrode 16.

Figure 1B:
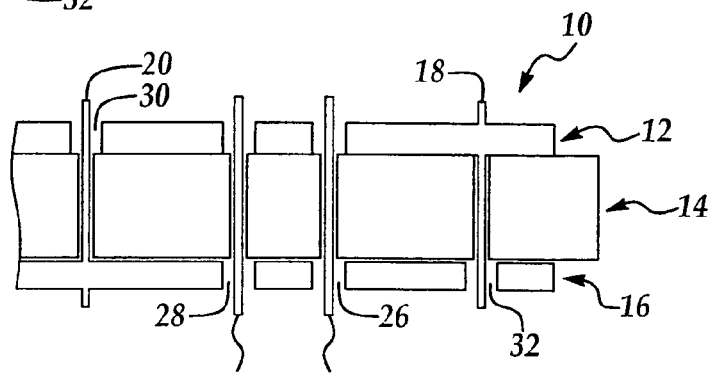
FIG. 1B is an enlarged, cross-sectional view of the present invention unitary buried array capacitor of FIG. 1A.

A suitable material for fabricating the top layer of electrode 12 and the bottom layer of electrode 16 may be Cu, Au, Ag, Pd, Pt or Al. The electrode layers 12,16 may be formed to a suitable thickness between about 0.1 μm and about 5 μm. When the two electrode layers and the dielectric layer are assembled together, as shown in FIG. 1B, a suitable distance between the top layer of electrode 12 and the bottom layer of electrode 16 is in-between 1 μm and 50 μm, and preferably between 5 μm and 15 μm. In the preferred embodiment, the distance between the two layers is about 10 μm.

The interconnect lines 22,24 can be suitably formed of a high electrical conductivity material such as Cu or Al. The middle layer of dielectric 14 should be formed of a dielectric material that has a high dielectric constant, i.e., higher than about 40, or in a range between about 40 and about 300. A suitable dielectric material having such high dielectric constant is a material that contains Ta and O, such as $Ta_2O_5$.

Figure 2A:
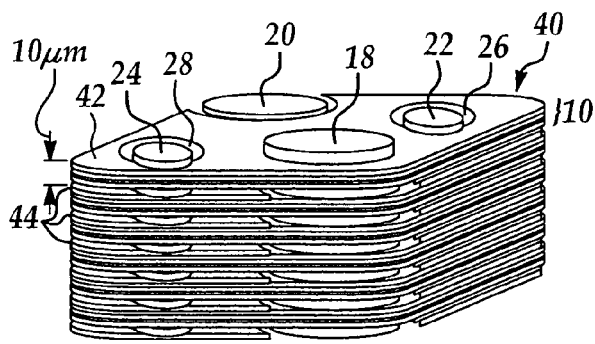
FIG. 2A is an enlarged, perspective view of the present invention buried array capacitor wherein a plurality of unitary capacitors are stacked together.
Figure 2B:
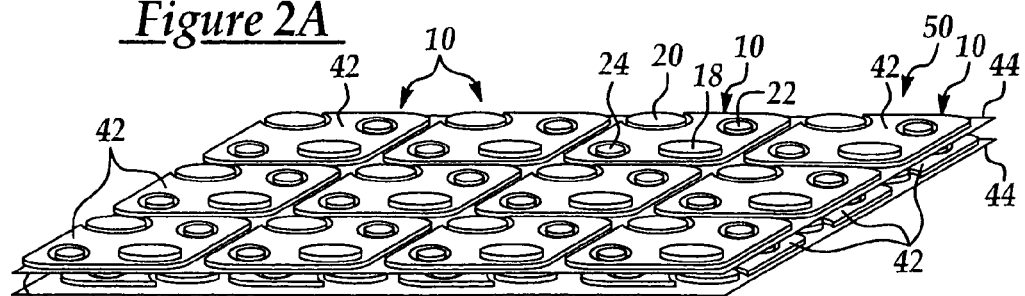
FIG. 2B is an enlarged, perspective view of the present invention buried array capacitor wherein a plurality of unitary capacitors are arranged in a side-by-side relationship.

The unitary buried array capacitor 10 of FIGS. 1A and 1B can be assembled, or formed together in a stack (shown in FIG. 2A) or in an array (shown in FIG. 2b). FIG. 2A shows a present invention buried array capacitor 40 which is formed by seven layers of electrode 42 and six layers of dielectric 44 stacked together in an up and down manner. Interconnect lines 22, 24 are fed through via holes 26, 28, respectively, without contacting the electrode layers 42. A first electrode lead 18 and a second electrode lead 20 further pass through the electrode layers 42 and the dielectric layers 44. It should be noted that both electrode leads only making electrical connection with alternating layers of the electrode layers 42 thus forming a buried array capacitor 40. The interconnect lines 22, 24 provide other necessary electrical connections to microelectronic devices that are later mounted on the buried array capacitor 40.

FIG. 2B shows an alternate embodiment of the present invention buried array capacitor 50 wherein a plurality of unitary buried array capacitors 10 are positioned in a side-by-side relationship forming the buried array capacitor 50. It should be noted that while the unitary buried array capacitor 10 is shown in a square shape in FIGS. 2a and 2B, it can be formed in any desirable shape. The dimensions of the unitary buried array capacitor 10 may also vary such that an array of, for instance, 4 cm×4 cm may be formed, or arrays as large as 20 cm×20 cm may be formed.

The capacitance of a capacitor can be expressed as $C=\epsilon A/d$ wherein C is the capacitance, e is the dielectric constant of the dielectric layer, A is the area of the capacitor, and d is the distance between the two electrode layers. It is seen that the thinner of the dielectric layer used in-between the two electrode layers, the larger the capacitance of the capacitor can be achieved.

Figure 3A:
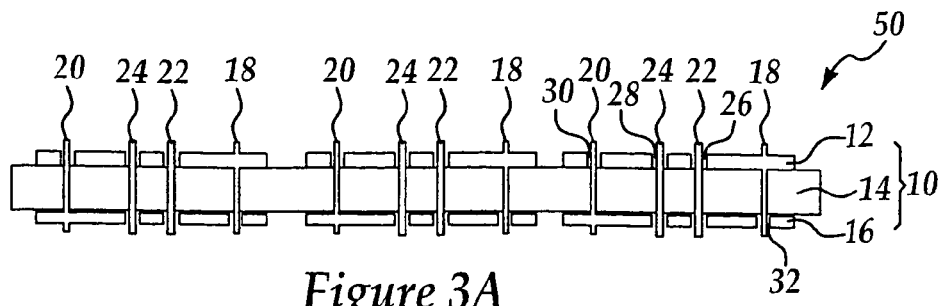
FIG. 3A is an enlarged, cross-sectional view of a present invention buried array capacitor having a single layer.

An enlarged, cross-sectional view of the present invention embodiment of FIG. 2b is shown in FIG. 3A. It is seen that three unitary buried array capacitors 10 are formed side-by-side in an array.

Figure 3B:
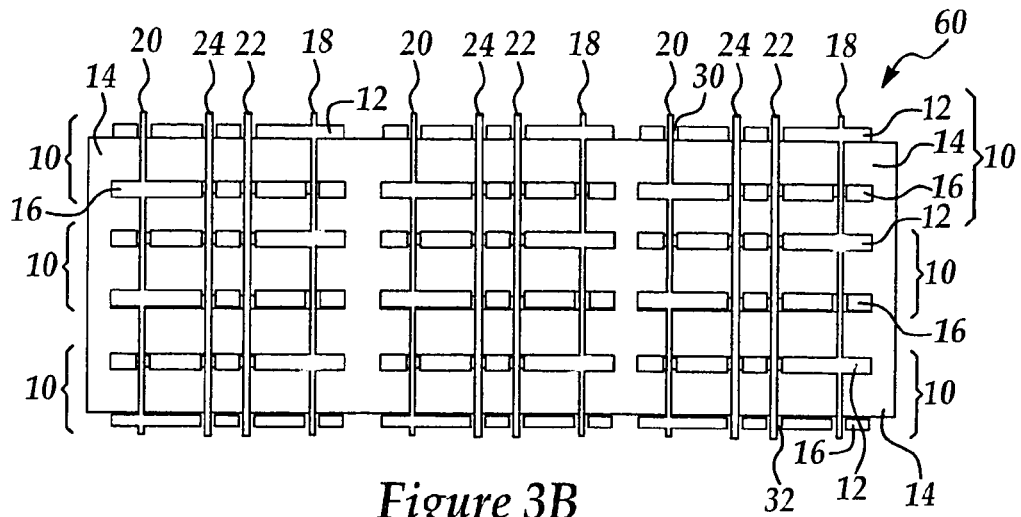
FIG. 3B is an enlarged, cross-sectional view of the present invention buried array capacitor having a multiple layer of capacitors.

Another embodiment similar to that shown in FIG. 3A, but with multiple layers of the unitary buried array capacitors 10, i.e., three layers, is shown in FIG. 3B. In this embodiment, larger capacitance can be obtained for a specific microelectronic circuit.

Figure 4A:
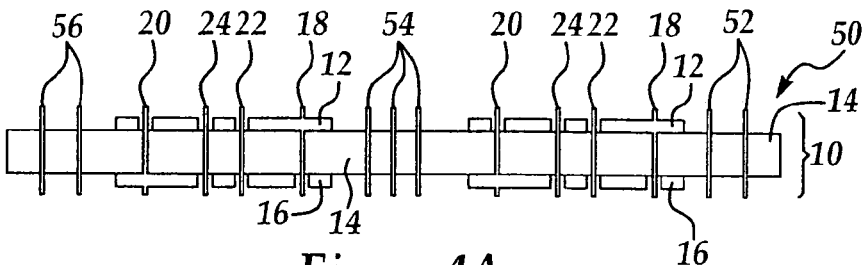
FIG. 4a is an enlarged, cross-sectional view of another embodiment of the present invention buried array capacitor having a single layer.
Figure 4B:
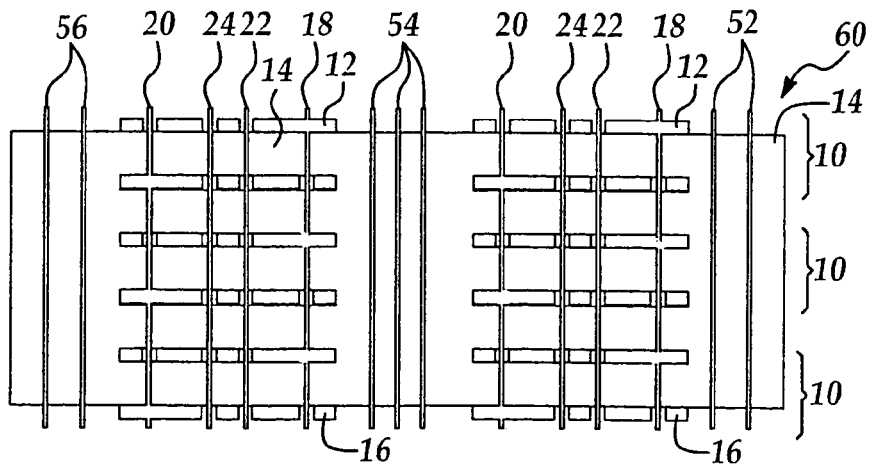
FIG. 4B is an enlarged, cross-sectional view of another embodiment of the present invention buried array capacitor having a plurality of layers.

In still other embodiments shown in FIGS. 4A and 4B, additional signal transmission lines 52, 54 and 56 are provided through a single layer buried array capacitor 50 or through a multiple layer buried array capacitor 60. These additional signal transmission lines 52, 54 and 56 an be used for various purposes for connecting to microelectronic devices (shown in FIGS. 6, 6A and 6B).

Figure 5:
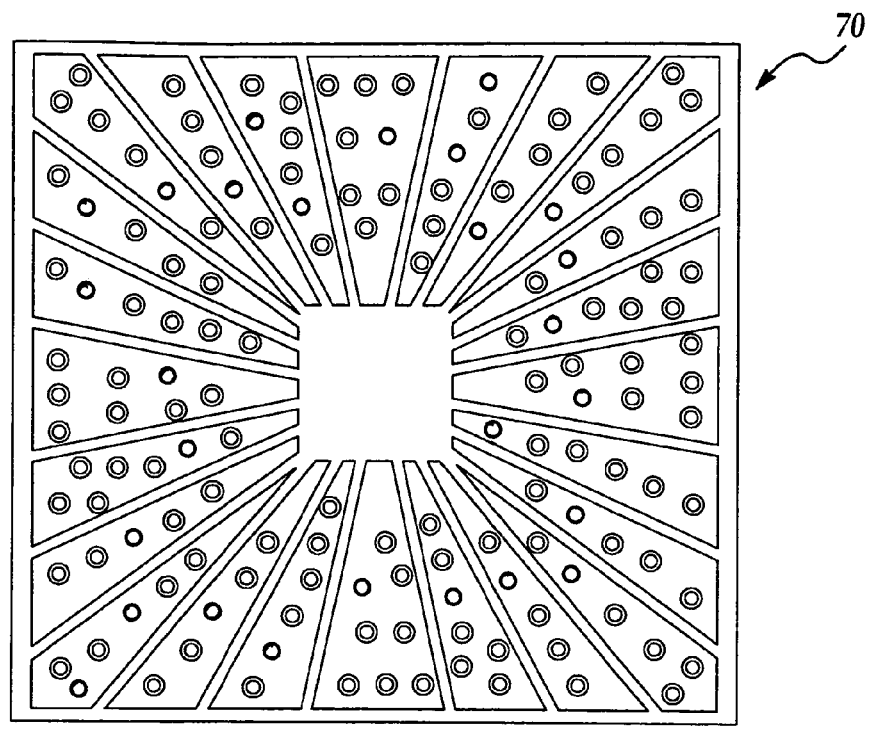
FIG. 5 is an enlarged, plane view of a present invention buried array capacitor.

FIG. 5 shows an enlarged, plane view of a present invention buried array capacitor 70 that can provide various embodiments of the invention. By suitably selecting specific areas of the layout for making electrical connections, a small, medium or large capacitor of any capacitance can be formed.

Figure 6:
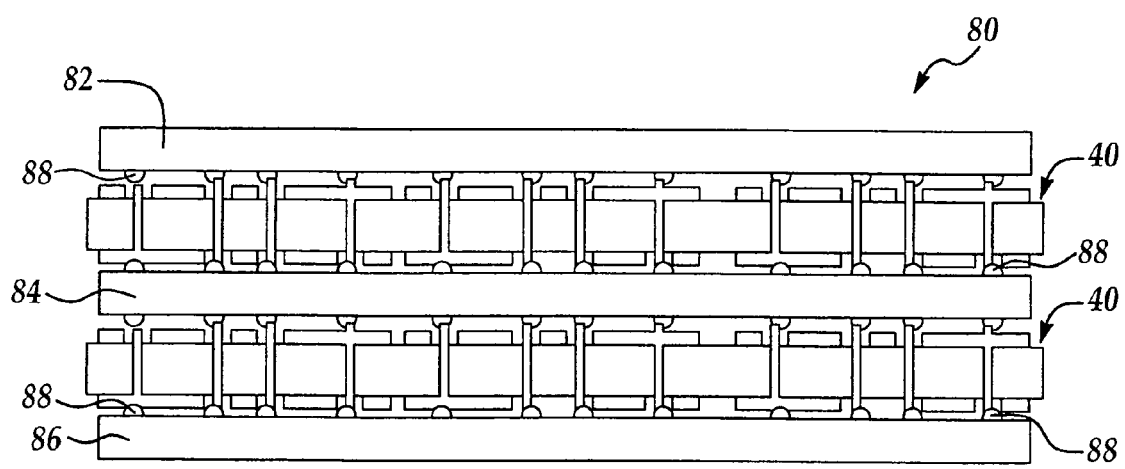
FIG. 6 is an enlarged, cross-sectional view of a microelectronic device incorporating the present invention buried array capacitors.

FIG. 6 is an enlarged, cross-sectional view of a microelectronic device 80 incorporating the present invention buried array capacitors 40. It is seen that integrated circuit chips 82, 84 and 86 are bonded to the buried array capacitors 40 by solder bumps 88.

Figure 6A:
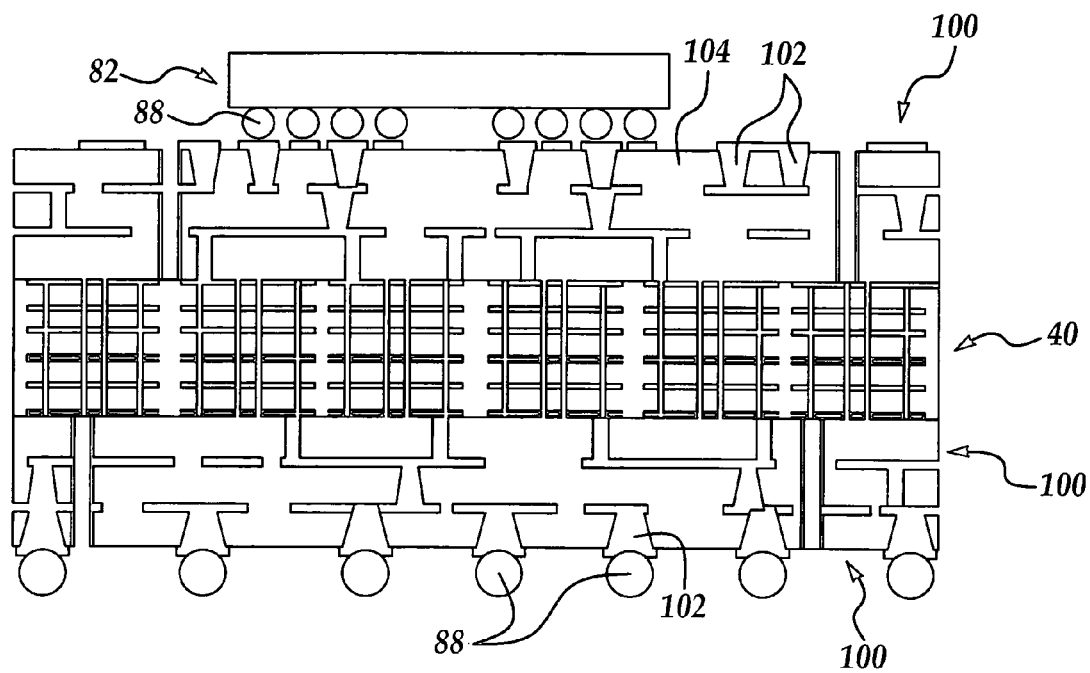
FIG. 6A is an enlarged, cross-sectional view illustrating a microelectronic structure incorporating the present invention buried array capacitor with a wiring layer inbetween.
Figure 6B:
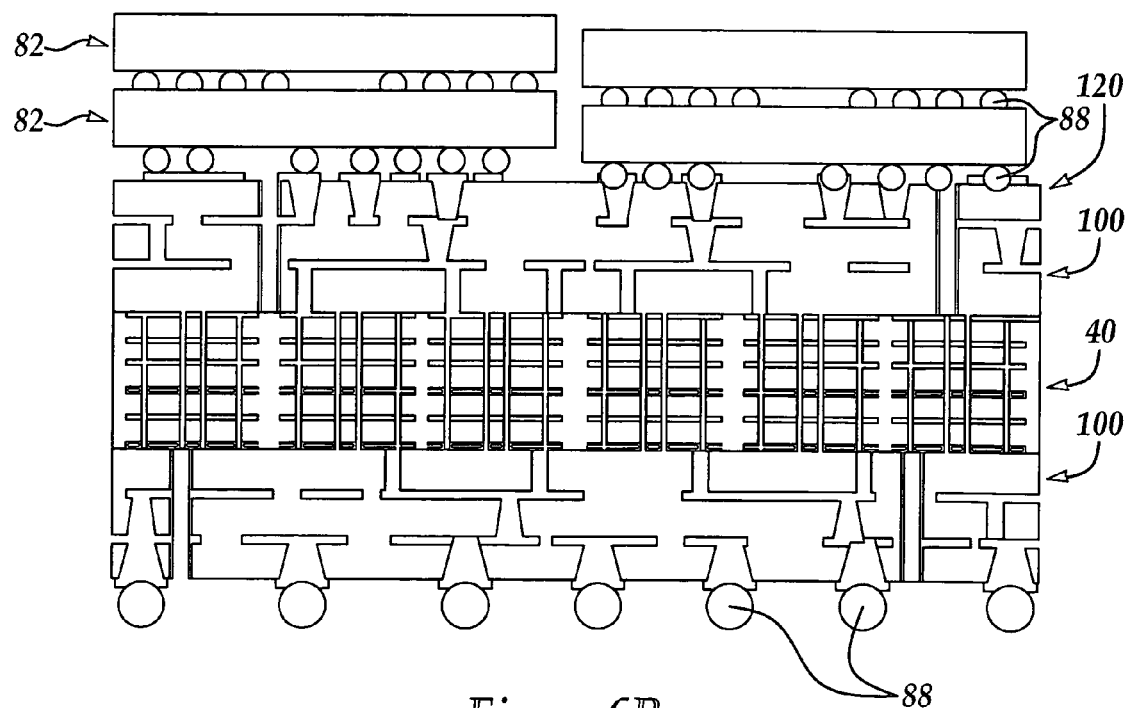

In other embodiments shown in FIGS. 6A and 6B, additional wiring layers 100 are incorporated into the microelectronic structure 110, 120. For instance, FIG. 6A shows an enlarged, cross-sectional view of microelectronic structure 100 incorporating the present invention buried array capacitors 40 with a wiring layer 100 connecting in-between the integrated circuit chip 82 and the buried array capacitor 40. The wiring layer 100 comprises a plurality of vias 102 and interconnect lines 104. Solder balls 88 are used connecting the surface mountable device, i.e., the integrated chip 82 to the wiring layer 100.

FIG. 6B is an enlarged, cross-sectional view of another embodiment of a microelectronic structure 120 formed with the present invention buried array capacitors 40 with a wiring layer 100 connecting in-between. Similarly solder balls 88 are used for providing electrical communication and physical connection of the integrated chips 82 to the wiring layer 100.

While the present invention has been described in an illustrative manner, it should be understood that the terminology used is intended to be in a nature of words of description rather than of limitation.

Furthermore, while the present invention has been described in terms of a preferred and various alternate embodiment, it is to be appreciated that those skilled in the art will readily apply these teachings to other possible variations of the inventions.

The embodiment of the invention in which an exclusive property or privilege is claimed are defined as follows.

What is claimed is:

1. A unitary buried array capacitor comprising:
   a top layer of electrode having a first electrode lead, a second electrode lead and at least one interconnect line therethrough wherein only said first electrode lead making electrical connection with said top layer of electrode;
   a middle layer of dielectric sandwiched between said top layer of electrode and a bottom layer of electrode having said first electrode lead, said second electrode lead and said at least one interconnect line therethrough;
   said bottom layer of electrode having said first electrode lead, said second electrode lead and said at least one interconnect line therethrough wherein only said second electrode lead making electrical connection with said bottom layer of electrode; and
   said at least one interconnect line passing through said top, middle and bottom layers without making electrical contact with said top layer or bottom layer.

2. A unitary buried array capacitor according to claim 1, wherein said top layer of electrode and said bottom layer of electrode being spaced apart by a distance between about 1 μm and about 50 μm.

3. A unitary buried array capacitor according to claim 1, wherein said top layer of electrode and said bottom layer of electrode being spaced apart by a distance between about 5 μm and about 15 μm.

4. A unitary buried array capacitor according to claim 1, wherein said middle layer of dielectric being formed of a material having a dielectric constant of at least 40.

5. A unitary buried array capacitor according to claim 1, wherein said middle layer of dielectric being formed of a material having a dielectric constant between about 40 and about 300.

6. A unitary buried array capacitor according to claim 1, wherein said middle layer of dielectric being formed of a material comprising Ta and O.

7. A unitary buried array capacitor according to claim 1, wherein said top layer of electrode and said bottom layer of electrode being formed of a material selected from the group consisting of Cu, Au, Ag, Pd, Pt and Al.

8. A unitary buried array capacitor according to claim 1, wherein said at least one interconnect line being formed of Cu or Al.

9. A buried array capacitor comprising:
   m unitary buried array capacitors each arranged stacked together in an up-an-down relationship with others wherein m being equal or greater than 2 and said unitary buried array capacitor comprises:
   a top layer of electrode having a first electrode lead, a second electrode lead and at least one interconnect line therethrough wherein only said first electrode lead making electrical connection with said top layer of electrode;
   a middle layer of dielectric sandwiched between said top layer of electrode and a bottom layer of electrode having said first electrode lead, said second electrode lead and said at least one interconnect line therethrough;
   said bottom layer of electrode having said first electrode lead, said second electrode lead and said at least one interconnect line therethrough wherein only said second electrode lead making electrical connection with said bottom layer of electrode; and
   said at least one interconnect line passing through said top, middle and bottom layers without making electrical contact with said top layer or bottom layer.

10. A buried array capacitor comprising:
    n unitary buried array capacitors each arranged in a side-by-side relationship with others wherein n being equal or greater than 2 and said unitary buried array capacitor comprises:
    a top layer of electrode having a first electrode lead, a second electrode lead and at least one interconnect line therethrough wherein only said first electrode lead making electrical connection with said top layer of electrode;
    a middle layer of dielectric sandwiched between said top layer of electrode and a bottom layer of electrode having said first electrode lead, said second electrode lead and said at least one interconnect line therethrough;
    said bottom layer of electrode having said first electrode lead, said second electrode lead and said at least one interconnect line therethrough wherein only said second electrode lead making electrical connection with said bottom layer of electrode; and
    said at least one interconnect line passing through said top, middle and bottom layers without making electrical contact with said top layer or bottom layer.

11. A buried array capacitor comprising:
    m unitary buried array capacitors each arranged stacked together in an up-an-down relationship with others; and
    n unitary buried array capacitors each arranged in a side-by-side relationship with others, wherein m and n being equal or greater than 2 and said unitary buried array capacitor comprises:
    a top layer of electrode having a first electrode lead, a second electrode lead and at least one interconnect line therethrough wherein only said first electrode lead making electrical connection with said top layer of electrode;
    a middle layer of dielectric sandwiched between said top layer of electrode and a bottom layer of electrode having said first electrode lead, said second electrode lead and said at least one interconnect line therethrough;
    said bottom layer of electrode having said first electrode lead, said second electrode lead and said at least one interconnect line therethrough wherein only said second electrode lead making electrical connection with said bottom layer of electrode; and
    said at least one interconnect line passing through said top, middle and bottom layers without making electrical contact with said top layer or bottom layer.

12. A buried array capacitor according to claim 11, wherein said top layer of electrode and said bottom layer of electrode being spaced apart by a distance between about 1 µm and about 50 µm.

13. A buried array capacitor according to claim 11, wherein said middle layer dielectric being formed of a material having a dielectric constant of at least 40.

14. A microelectronic structure incorporating at least one buried array capacitor comprising:
   m unitary buried array capacitors each arranged stacked together in an up-an-down relationship with others; and
   n unitary buried array capacitors each arranged in a side-by-side relationship with others, wherein m and n being equal or greater than 2 and said unitary buried array capacitor comprises:
   a top layer of electrode having a first electrode lead, a second electrode lead and at least one interconnect line therethrough wherein only said first electrode lead making electrical connection with said top layer of electrode;
   a middle layer of dielectric sandwiched between said top layer of electrode and a bottom layer of electrode having said first electrode lead, said second electrode lead and said at least one interconnect line therethrough;
   said bottom layer of electrode having said first electrode lead, said second electrode lead and said at least one interconnect line therethrough wherein only said second electrode lead making electrical connection with said bottom layer of electrode;
   said at least one interconnect line passing through said top, middle and bottom layers without making electrical contact with said top layer or bottom layer;
   a first wiring layer on said top layer of electrode;
   a second wiring layer on said bottom layer of electrode; and
   at least one integrated circuit device mounted on at least one of said first and said second wiring layers in electrical communication with said buried array capacitor.

15. A microelectronic structure incorporating a buried array capacitor according to claim 14, wherein said top layer of electrode and said bottom layer of electrode being spaced apart by a distance between about 1 µm and about 50 µm.

16. A unitary buried array capacitor according to claim 14, wherein said top layer of electrode and said bottom layer of electrode being spaced apart by a distance between about 5 µm and about 15 µm.

17. A unitary buried array capacitor according to claim 14, wherein said middle layer of dielectric being formed of a material having a dielectric constant of at least 40.

18. A unitary buried array capacitor according to claim 14, wherein said middle layer of dielectric being formed of a material having a dielectric constant between about 40 and about 300.

19. A unitary buried array capacitor according to claim 14, wherein said top layer of electrode and said bottom layer of electrode being formed of a material selected from the group consisting of Cu, Au, Ag, Pd, Pt and Al.

20. A unitary buried array capacitor according to claim 14, wherein said at least one interconnect line being formed of Cu or Al.

21. A microelectronic structure according to claim 14, wherein said first wiring layer and said second wiring layer further comprising at least one common node each for connecting to at least one of said at least one interconnect line that are at the same voltage such that said m unitary buried array capacitors and said n unitary buried array capacitors may be connected in parallel or in series.

22. A microelectronic structure according to claim 14, wherein said first wiring layer and said second wiring layer are formed by a printed circuit process.

23. A microelectronic structure according to claim 14, wherein said first wiring layer and said second wiring layer are formed by a microelectronic material deposition method.

* * * * *